(12) United States Patent
Ko et al.

(10) Patent No.: US 6,861,362 B2
(45) Date of Patent: Mar. 1, 2005

(54) SELF-ALIGNED CONTACT PROCESS IMPLEMENTING BIAS COMPENSATION ETCH ENDPOINT DETECTION AND METHODS FOR IMPLEMENTING THE SAME

(75) Inventors: Jun-Cheng Ko, Taichung (TW); Young-Tong Tsai, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 18 days.

(21) Appl. No.: 09/895,566

(22) Filed: Jun. 29, 2001

(65) Prior Publication Data

US 2003/0000923 A1 Jan. 2, 2003

(51) Int. Cl.[7] .............................................. H01L 21/302
(52) U.S. Cl. .............................. 438/706; 438/7; 438/9; 438/710; 216/60
(58) Field of Search ................................ 438/706, 710, 438/712, 720, 7, 9, 180, 299, 300; 216/58, 67, 59, 60, 61

(56) References Cited

U.S. PATENT DOCUMENTS

| | | | |
|---|---|---|---|
| 5,198,072 A | * 3/1993 | Gabriel | ........................ 156/345 |
| 5,242,532 A | * 9/1993 | Cain | ........................... 156/345 |
| 5,843,815 A | * 12/1998 | Liaw | ........................... 438/238 |
| 5,854,135 A | * 12/1998 | Ko | ............................... 438/712 |
| 5,871,658 A | * 2/1999 | Tao et al. | ...................... 216/60 |
| 6,228,278 B1 | * 5/2001 | Winniczek et al. | ........... 216/61 |

* cited by examiner

Primary Examiner—Lan Vinh
(74) Attorney, Agent, or Firm—Martine, Penilla & Gencarella, LLP

(57) ABSTRACT

A method for enhancing the fabrication process of a self-aligned contact (SAC) structure is provided. The method includes forming a transistor structure on a surface of a substrate. The method also includes forming a dielectric layer directly over the surface of the substrate without forming an etch stop layer on the surface of the substrate. Also included in the method is plasma etching a contact hole through the dielectric layer in a plasma processing chamber. The method also includes monitoring a bias compensation voltage of the plasma processing chamber during the plasma etching process and discontinuing the plasma etching process upon detecting an endpoint signaling change in the bias compensation voltage.

19 Claims, 8 Drawing Sheets

SELF-ALIGNED CONTACT PROCESS IMPLEMENTING BIAS COMPENSATION ETCH ENDPOINT DETECTION AND METHODS FOR IMPLEMENTING THE SAME

BACKGROUND OF THE INVENTION

1. Field of the Invention

The present invention relates generally to the fabrication of semiconductor devices and, more particularly, to improving the fabrication sequence in self-aligned contact processes by enhancing the etch endpoint detection of a desired layer.

2. Description of the Related Art

As is well known, in semiconductor manufacturing, different processes can be implemented to fabricate millions of transistors on a semiconductor chip. An exemplary process is a self-aligned contact (SAC) process, which traditionally is implemented in several stages. First, in the silicon nitride ($SiN_3$) spacer etch process stage, a silicon nitride layer is deposited on a surface of substrate having fabricated transistors. As is well known, each transistor includes source/drain diffusion regions, a conductive polysilicon gate, and a dielectric gate oxide. This silicon nitride layer is subsequently etched utilizing a plasma etch process, thereby creating silicon nitride spacers alongside the polysilicon gates. Second, in the stop layer cap deposit process stage, a stop layer (e.g., silicon nitride) is deposited over the gate oxides as well as the source/drain diffusion regions. Next, the interlevel dielectric layer (ILD) is formed in the ILD oxide deposit process stage through successive depositions of a high density plasma (HDP) oxide layer, a tetraethylorthosilicate (TEOS) deposition layer, and an oxide deposition layer (e.g., silicon dioxide).

Next, in the contact lithography process stage, the surface of the ILD layer is patterned using the photoresist mask defining unprotected contact-like portions. Then, in the ILD oxide etch process stage, exposed portions of the ILD layer are selectively removed during an etching process implementing a first set of chemicals. Thereafter, the etching process is repeated in the following stop layer liner etch process stage, wherein the exposed portions of the stop layer (typically, made out of silicon nitride) are removed implementing a second set of chemicals. As is well known, implementing two different sets of chemicals to etch the exposed portions of the ILD oxide layer and silicon nitride stop layer is important, as the removal of silicon nitride requires chemicals with higher selectivity.

Generally, SAC ILD oxide etch and SAC silicon nitride stop layer liner etch implement a dry etching method called plasma etching. The plasma etching process is typically performed in a plasma chamber in which strong electrical fields cause high energy gases containing positively charged ions and negatively charged electrons to be accelerated toward the exposed surface areas of the ILD layer and silicon nitride stop layer. In actuality, the exposed portions of the ILD layer and silicon nitride stop layer are physically removed as a result of being bombarded with positive ions. However, etching the exposed portions of the ILD and silicon nitride stop layers must stop once it has been determined that the ILD and silicon nitride stop layers have been etched through. As a result, it is imperative to implement an endpoint detection method to stop the etching process once the desired layer has been etched through.

Predominantly, either time mode or optical emission spectroscopy is used to detect the etch endpoint of a desired layer. In the time mode, the thickness of the desired layer as well as the etch rate of the material being removed are used to calculate the approximate length of time required to remove the desired layer. However, because the thickness of wafers and layers formed thereon vary, the time mode has proven to be an unreliable and inefficient method for etch endpoint detection. For instance, due to wafer-to-wafer thickness variation, overetching or underetching of the desired layer may occur. By way of example, the former may cause the removal of portions of the underlying silicon substrate layer or polysilicon gate whereas the latter necessitates further work on the wafer so as to remove the remaining exposed portions.

In the alternative optical emission spectroscopy method, the light emitted by the gases within the etch reactant chamber is used to identify the specific material being etched. As the light emission intensity is directly proportional to the concentration of a specific gas within the etch reactant chamber, the endpoint detector can in theory determine when the etching of a desired material has concluded. However, as the changes in the semiconductor substrate fabrication design rules have enabled the fabrication of smaller and smaller semiconductor substrates, the surface area of contacts and vias (i.e., the exposed oxide portions of the ILD layer) have shrunk (for instance, compare a typical contact oxide area which ranges from 2% to 0.5% to an expected contact oxide area of 0.2% in the near future). Consequently, the concentration of the material being etched in the plasma has decreased, thus creating a rather small change in the plasma at etch endpoint. Ultimately, this small change in the plasma results in small changes in the optical emission signal, thus hindering the optical emission endpoint detection process. Additionally, the optical emission endpoint is designed to be monitored through a transparent window defined within etch reactant chamber. However, as the etching process progresses, monitoring optical emission endpoint signal becomes impossible since visibility reduces as etch polymers build up and cover the transparent window over time. As a result, the optical emission endpoint has also proven to be unreliable in etch endpoint detection, as overetching or underetching of the desired layer may occur.

Accordingly, currently, silicon nitride stop layers are being implemented to compensate for the overetching of the underlying layers. However, besides creating a margin for error, silicon nitride stop layers are not required in the fabrication of the semiconductor devices. Thus, the unreliability of the two predominantly implemented etch endpoint detection processes has added two extra fabrications stages to the SAC contact etch processes, unnecessarily increasing the cost associated with SAC contact process while needlessly reducing throughput.

In view of the foregoing, a need exists for a semiconductor fabrication methodology that eliminates extra fabrication stages implemented in a self-aligned contact process thus reducing fabrication cost while increasing wafer throughput.

SUMMARY OF THE INVENTION

Broadly speaking, the present invention fills these needs by providing an apparatus and methodology for optimizing the self-aligned contact processes through eliminating the stop layers, thereby reducing fabrication cost while increasing wafer throughput. Preferably, an interlevel dielectric (ILD) layer of the present invention is formed substantially directly on the substrate and the gate structures without a need to include stop layers as a process margin. In one preferred embodiment, the present invention implements an anticipated ascertained change in a compensation bias voltage of an electrostatic chuck disposed within a reactant etch chamber as evidence of etch endpoint of a desired layer in self-aligned contact (SAC) processes.

It should be appreciated that the present invention can be implemented in numerous ways, including as a process, an apparatus, a system, a device, or a method. Several inventive embodiments of the present invention are described below.

In one embodiment, a method for enhancing the fabrication process of a self-aligned contact (SAC) structure is disclosed. The method includes forming a transistor structure on a surface of a substrate. The method also includes forming a dielectric layer directly over the surface of the substrate without forming an etch stop layer on the surface of the substrate. Also included in the method is plasma etching a contact hole through the dielectric layer in a plasma processing chamber. The method also includes monitoring a bias compensation voltage of the plasma processing chamber during the plasma etching process and discontinuing the plasma etching process upon detecting an endpoint signaling change in the bias compensation voltage.

In another embodiment, a method for enhancing the fabrication process of a self-aligned contact (SAC) is disclosed. The method includes forming a transistor structure on a substrate. The transistor structure includes a gate structure formed over a first surface of the substrate. The method further includes forming spacers along sidewalls of the gate structure and forming source/drain diffusion regions into the first surface of substrate. The source/drain diffusion regions are defined substantially outside of the spacers formed along the sidewalls of the gate structure. The method further includes forming an interlevel dielectric (ILD) layer directly over the first surface of the substrate such that the ILD layer overlies the gate structure, the spacers, and the first surface of the substrate without forming a stop layer. The method also includes forming a contact hole and a via hole in the ILD layer implementing a plasma etching process. As designed, the contact hole is defined to a top layer of the gate structure and the via hole is defined to the source/drain diffusion regions. Further included in the method are monitoring a bias compensation voltage during the plasma etching process and discontinuing the plasma etching process when an endpoint signaling change in the bias compensation voltage is detected.

In still another embodiment, a bias compensation self-aligned contact (SAC) etch endpoint detecting system is disclosed. The system includes an etch reactant chamber, an ESC power supply, and a signal processing computer. The etch reactant chamber is configured to include an electrostatic chuck (ESC) designed to support a substrate having an ILD layer to be etched, a top electrode, and a bottom electrode. The ESC power supply is coupled to the ESC and is configured to function as a bias compensating power supply. The signal processing computer is configured to monitor a bias compensation signal generated by the ESC power supply. The etch process is carried out in the etch reactant chamber and is configured to be discontinued when the bias compensation signal is determined to have a previously ascertained characteristic evidencing an etch endpoint of the ILD layer.

In yet another embodiment, a method for accurately detecting a plasma etch endpoint of a self-aligned contact (SAC) is disclosed. The method includes providing a substrate having a transistor structure on a surface of the substrate. Also included in the method is forming a dielectric layer directly over the surface of the substrate without forming an etch stop layer thereon. The method further includes inserting the substrate into a plasma etching chamber so as to plasma etch a contact hole into the dielectric layer. Also included are introducing etchant gases into the plasma etching chamber and powering up the plasma etching chamber. The powering up of the plasma etching chamber is configured to strike a plasma so as to commence the plasma etching process. The method also includes monitoring a bias level of the plasma etching chamber during the plasma etching process and discontinuing the plasma etching process when an endpoint signaling change in the bias compensation voltage is detected.

The advantages of the present invention are numerous. Most notably, bias compensation self-aligned contact etch process of the present invention eliminates unnecessary fabrication stages associated with the stop layers, thus reducing the fabrication cost. Additionally, as the bias compensation SAC contact etch process of the present invention can accurately control the etch process, the SAC contact etch process of the present invention can be stopped once the underlying source/drain regions or polysilicon gates are exposed. Thus, the bias compensation SAC etch process of the present invention can be used to repeatedly and accurately detect etch endpoint in wafers having different thickness. Yet another advantage is that the bias compensation SAC process of the present invention implements an ascertained anticipated change in the bias compensation voltage as evidence of etch endpoint. Yet another advantage is that as the bias compensation SAC etch process of the present invention implements changes in the resistive properties of the wafer. This is in contrast to the time mode and optical emission methods which respectively implement the time and removal rate of a specific material or changes in the plasma to detect the etch endpoint. In this manner, the embodiments of the present invention eliminate the shortcomings associated with the time mode and optical emission spectroscopy etch endpoint detection methods.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention for increasing wafer throughput while minimizing costs incurred in fabricating self-aligned contact processes through eliminating stop layers, is disclosed. Preferably, the present invention implements an expected ascertained change in a compensation bias voltage of an electrostatic chuck disposed within a reactant etch chamber as evidence of etch endpoint in a self-aligned contact process. In one embodiment, the present invention correlates a step increase in a bias compensation voltage of an electrostatic chuck disposed within an etch reactant chamber with the length of time required to physically remove an interlevel dielectric layer (ILD) layer before exposing the underlying source/drain diffusion regions or gate structures.

Figure 1A:
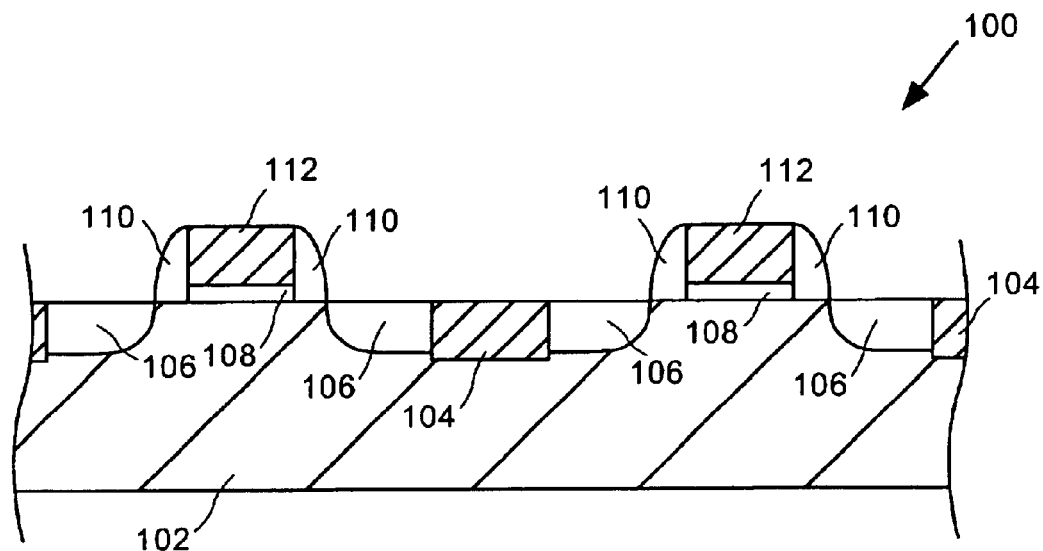
FIGS. 1A–1C depict the different stages of fabricating a wafer implementing a self-aligned contact (SAC) process, in accordance with one embodiment of the present invention.
Figure 1B:
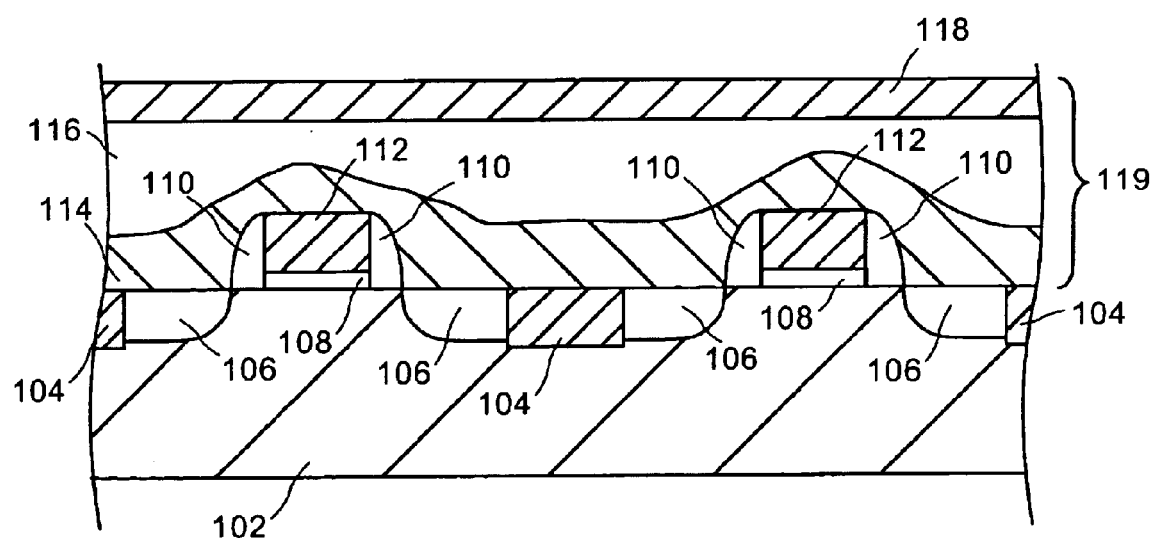
Figure 1C:
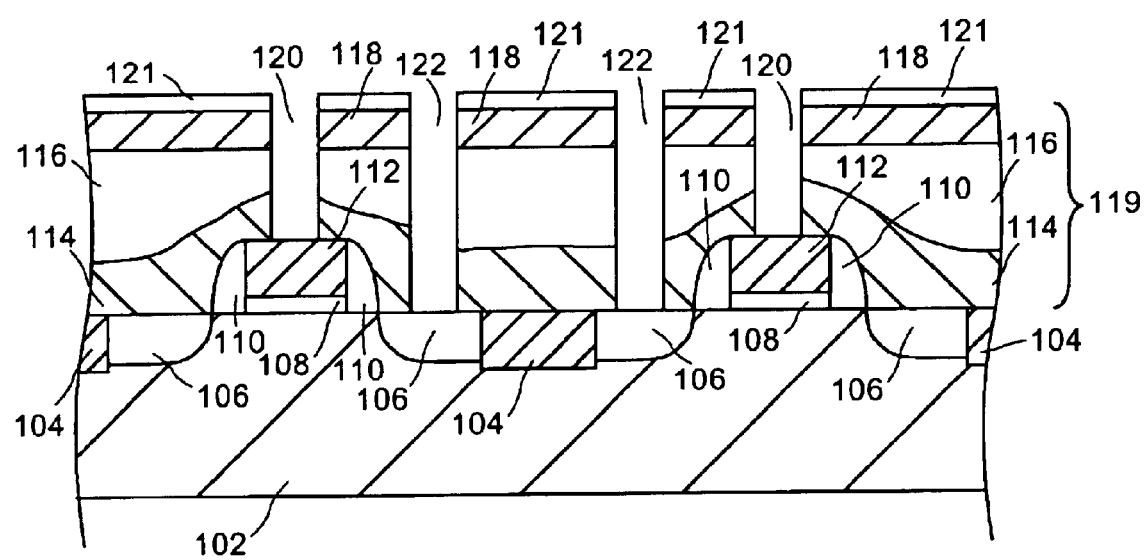

FIGS. 1A–1C depict the different stages of fabricating a wafer 100 implementing a self-aligned contact (SAC) process, in accordance with one embodiment of the present invention. As shown, the embodiment of FIG. 1A depicts a substrate 102 subsequent to the fabrication of spacers 110. The substrate 102 has a plurality of transistors, each of which includes source/drain diffusion regions 106, a conductor polysilicon gate 108, a dielectric gate oxide 112, and spacers 110. Typically, in the SAC process, the spacers 110 are made out of silicon nitride and are formed alongside the polysilicon gates 108 and gate oxides 112. For instance, in the first process stage, the spacers 110 are formed through depositing a silicon nitride layer on the surface of the substrate 102 and polysilicon gates 108, and subsequently etching the same by using a plasma etching process. Also included in the illustrated substrate 102 are shallow trench isolation regions (STIs) 104.

Following the formation of the spacers 110, impurities are implanted into the source/drain diffusion regions 106 of the substrate 103 outside of the polysilicon gates 108, gate oxides 112, and the spacers 110. Once implanted, a heat treatment is performed so as to activate the impurities implanted within the source/drain diffusion regions 106. Thereafter, in the second process stage depicted in the embodiment of FIG. 1B, an interlevel dielectric layer (ILD) 119 is formed over the substrate 102. As shown, the ILD layer 119 is created through consecutive deposition of an oxide layer 114 using the high-density plasma chemical vapor deposition (HDPCVD) technique, a tetraethylorthosilicate (TEOS) layer 116, and an oxide layer 118. Of course, any suitable oxide formation process may be used.

Next referring to FIG. 1C, the third and fourth stages of the SAC process of the present invention can further be understood. In the contact lithography process stage (i.e., the third process stage), a photoresist mask 121 is used to pattern the ILD layer 119 defining unprotected and exposed contact/via-like portions thereon. Subsequently, in the SAC oxide etch process stage (i.e., fourth process stage), the exposed portions of the ILD layer 119 are selectively removed in a plasma etching process implementing a set of chemicals. In this manner, a plurality of contact holes 120 and via holes 122 are formed within the ILD layer 119, which once filled with a conductive material will provide electrical connection between the successive conductive layers.

As will be discussed in more detail below, the present invention eliminates the silicon nitride stop layers by implementing bias compensation etch endpoint detection. Consequently, the SAC process of the present invention employs two process stages less than the conventional SAC processes. Specifically, the present invention eliminates the silicon nitride cap deposition and SAC silicon nitride liner etch, as the bias compensation endpoint detection provides such accuracy, which renders using stop layers as process margins redundant. As a consequence, the present invention reduces fabrication cost incurred in SAC processes while it increases wafer throughput.

Figure 2:
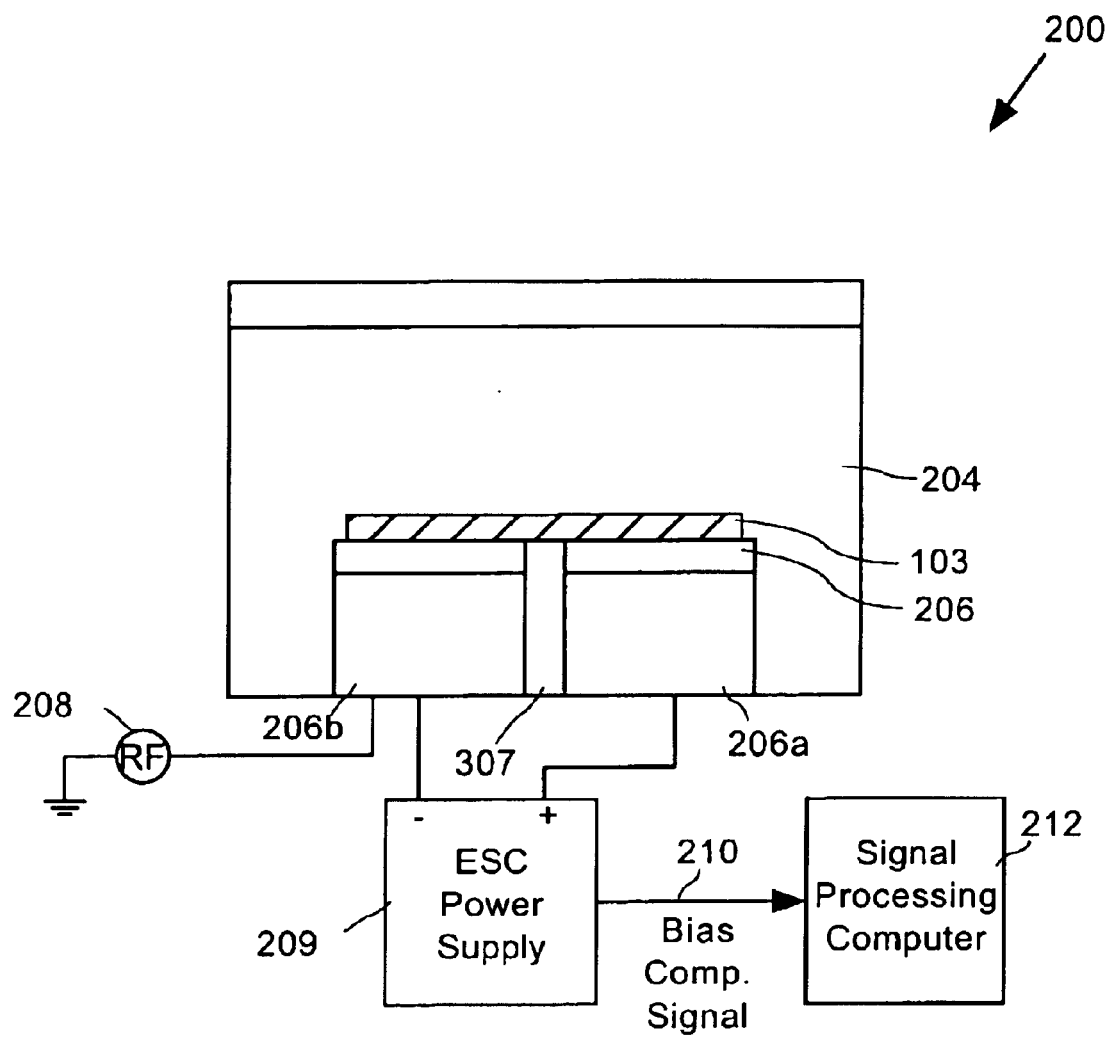
FIG. 2 is a schematic and simplified illustration of an exemplary bias compensated bi-polar ESC etch system, in accordance with another embodiment of the present invention.

FIG. 2 is a schematic and simplified illustration of an exemplary bias compensated bi-polar ESC etch system 200, in accordance with one embodiment of the present invention. The bias compensated bi-polar ESC etch system 200 includes an etch reactant chamber 204, a bi-polar ESC 206, a radio frequency (RF) power supply 208, an ESC power supply 209, and a signal processing computer 212. The bi-polar ESC 206 includes a pair of conductive portions, poles 206a and 206b configured to function as a pair of electrodes. The pole 206a is coupled to a positive terminal of the ESC power supply 209 and is configured to function as a positive pole. In a like manner, the pole 206b is coupled to a negative terminal of the ESC power supply 209 and is designed to function as the negative pole. A supply tube 307 formed within the ESC chuck 206 is configured to deliver a cooling gas (e.g., helium, etc.) to the wafer 103 during the etch process.

As shown in FIG. 2, the RF power supply 208 is coupled to the electrostatic chuck (ESC) 206 and is configured to excite the plasma released into the etch reactant chamber 204. Once activated, the ESC power supply 209, the RF power supply 208, and the plasma released into the etch reactant chamber 204 are configured to induce a positive potential and negative potential on the respective positive pole 206a and negative pole 206b. As a result, electrostatic forces are generated between the positive and negative poles 206a and 206b and their respective overlaying regions of the wafer 103. In this manner, the generated electrostatic forces securely hold the wafer 103 in place with respect to the ESC 206 during the etching process.

Besides assisting to keep the wafer 103 in place with respect to the ESC 206, the ESC power supply 209 further functions as a bias compensating high-voltage supply that powers the ESC 206. As used herein, "bias compensation" is defined as a method used to regulate the voltage present on the wafer 103. As designed, the current from the ESC 206 to the plasma is minimized, thereby ensuring equal clamping force at each of the positive and negative poles 206a and 206b by generating equal electrostatic force between each of the positive and negative poles 206a and 206b and the plasma.

The signal processing computer 212 monitors a bias compensation signal 210 generated by the ESC power supply 209 in real time. As designed, the bias compensation signal 210 is configured to be sensitive to any change in the resistance of the wafer 103. As will be discussed in more detail with respect to FIGS. 3A–3B and 4, the embodiments of the present invention implement an endpoint signaling change. That is, the embodiments of the present invention implement a previously ascertained step increase (e.g., change) in the bias compensation signal 210 generated by the ESC power supply 209 to detect the etch endpoint.

Figure 3A:
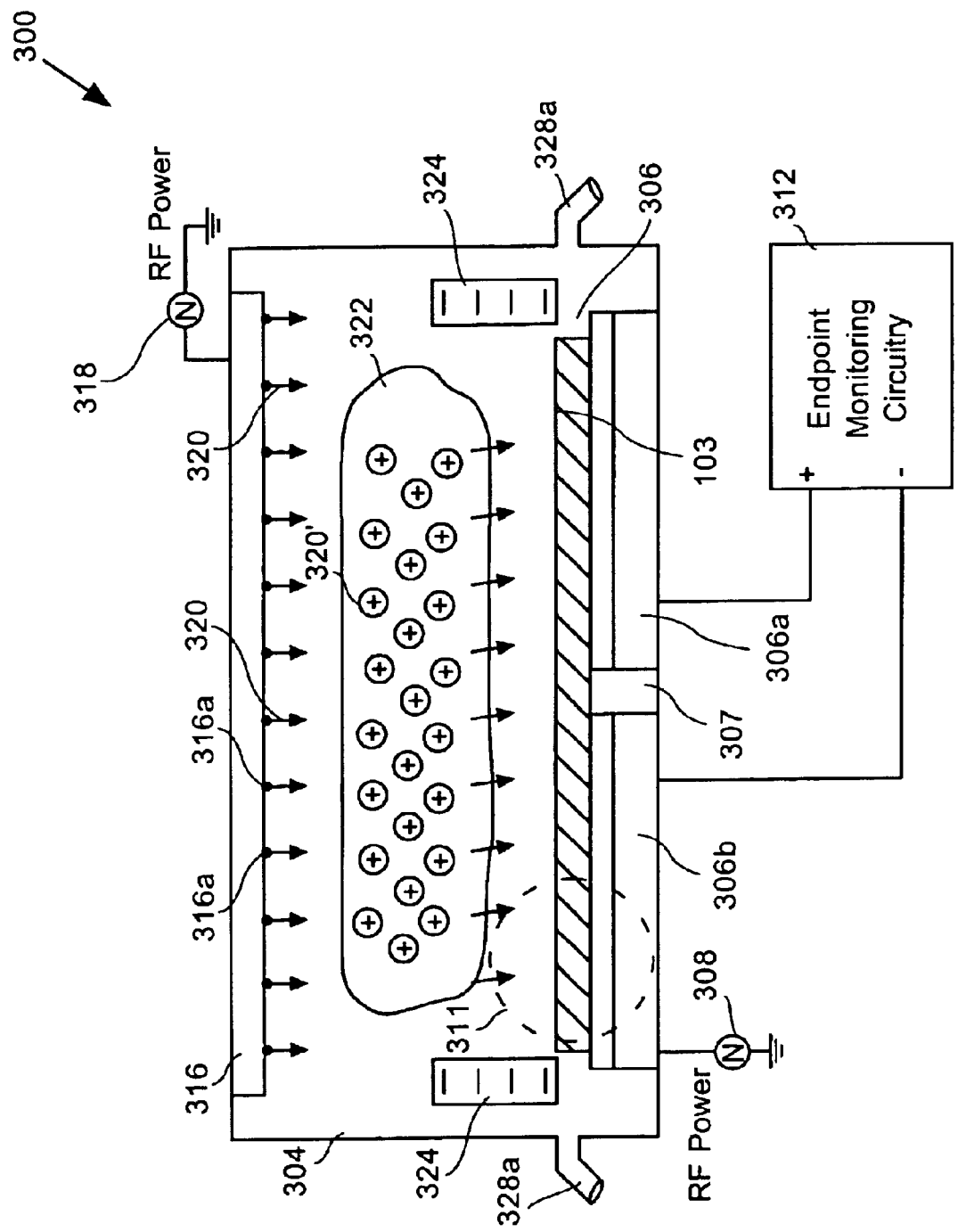
FIG. 3A is a schematic and simplified illustration of an exemplary bias compensation etch system, in accordance with yet another embodiment of the present invention.

An ascertained change in the bias compensation voltage of an ESC 306 due to the creation of an electrical path between a plasma 322 and the wafer 103 can further be understood with respect to an exemplary bias compensation etch system 300 depicted in FIG. 3A, in accordance with one embodiment of the present invention. The bias compensation etch system 300 includes an etch reactant chamber 304, RF power components 308 and 318, and an endpoint monitoring circuitry 312. As illustrated in the embodiment of FIG. 3A, the RF power component 318 is coupled to the shower head 316 and is configured to excite the plasma 320 from the above while the RF power component 308 is coupled to the ESC 306 so as to excite the plasma 320 from below. As shown, the RF power components 318 and 308 are grounded.

Disposed within the etch reactant chamber 304 are the showerhead 316, a plurality of containment rings 324, the ESC 306, and a wafer 103. The plasma 320 is created in a plasma region 322 disposed within the etch reactant chamber 304, and process gasses are passed through the showerhead 316 having a plurality of holes 316a. The containment rings 322 are configured to substantially confine the plasma 320 within the plasma region 322. The wafer 103 is disposed over the ESC 306 and may be any suitable semiconductor wafer or substrate. A plurality of exhaust pipes 328a and 328b are disposed outside of the etch reactant chamber 304 to release the contents of the reactant etching chamber 304 (e.g., plasma 320, by-products, polymers, etc.)

The ESC 306 depicted in this example is a bi-polar ESC and is configured to have a pair of electrodes 306a and 306b, respectively, coupled to a positive and negative terminals of the endpoint monitoring circuitry 312. The ESC 306 may further include one or more supply tubes 307, which may be fed through one or more portions of the ESC 306 so as to supply a cooling gas. Additionally, one of ordinary skill in the art must appreciate that the ESC poles may assume any configuration.

As described in more detail with respect to FIG. 2, the endpoint monitoring circuitry 312 performs several functions. For instance, the endpoint monitoring circuitry 312 functions as a bias compensating power supply that provides power to the ESC 306. The endpoint monitoring circuitry further generates a bias compensation signal, which reflects the changes in the resistance of the wafer 103. Yet another function of the endpoint monitoring circuitry 312 is to monitor the bias compensation signal, searching for the expected change in the bias compensation, as the etch process approaches the endpoint.

The SAC plasma etch process of the present invention is configured to follow a specific combination of process parameters to etch through the ILD layer (e.g., etch reactant chamber pressure, gas mixtures, gas flow rates, temperature, RF power (top and bottom), wafer position with respect to the plasma, etc.). Preferably, in one implementation, to etch through the ILD layer, the plasma etch process maintains approximately about 82 militorr (mT) pressure inside the etch reactant chamber. The plasma etch process further applies approximately about 1400 watts (W) and 1100 watts (W) through the RF power component 318 and RF power component 308, respectively. Additionally, the chemistry implemented preferably contains argon, $C_4F_6$, oxygen, each having a flow rate of 260 standard cubic centimeter per minute (sccm), 11 sccms, 12 sccms, respectively. However, it must be appreciated by one having ordinary skill in the art that depending on the type of material being etched, a wide range of gas chemistries may be implemented (e.g., fluorine may be used to etch $SiO_2$, chlorine may be used to etch aluminum, and chlorine, fluorine, and bromine may be used to etch silicon, oxygen may be used to etch photoresist, etc.).

Figure 3B:
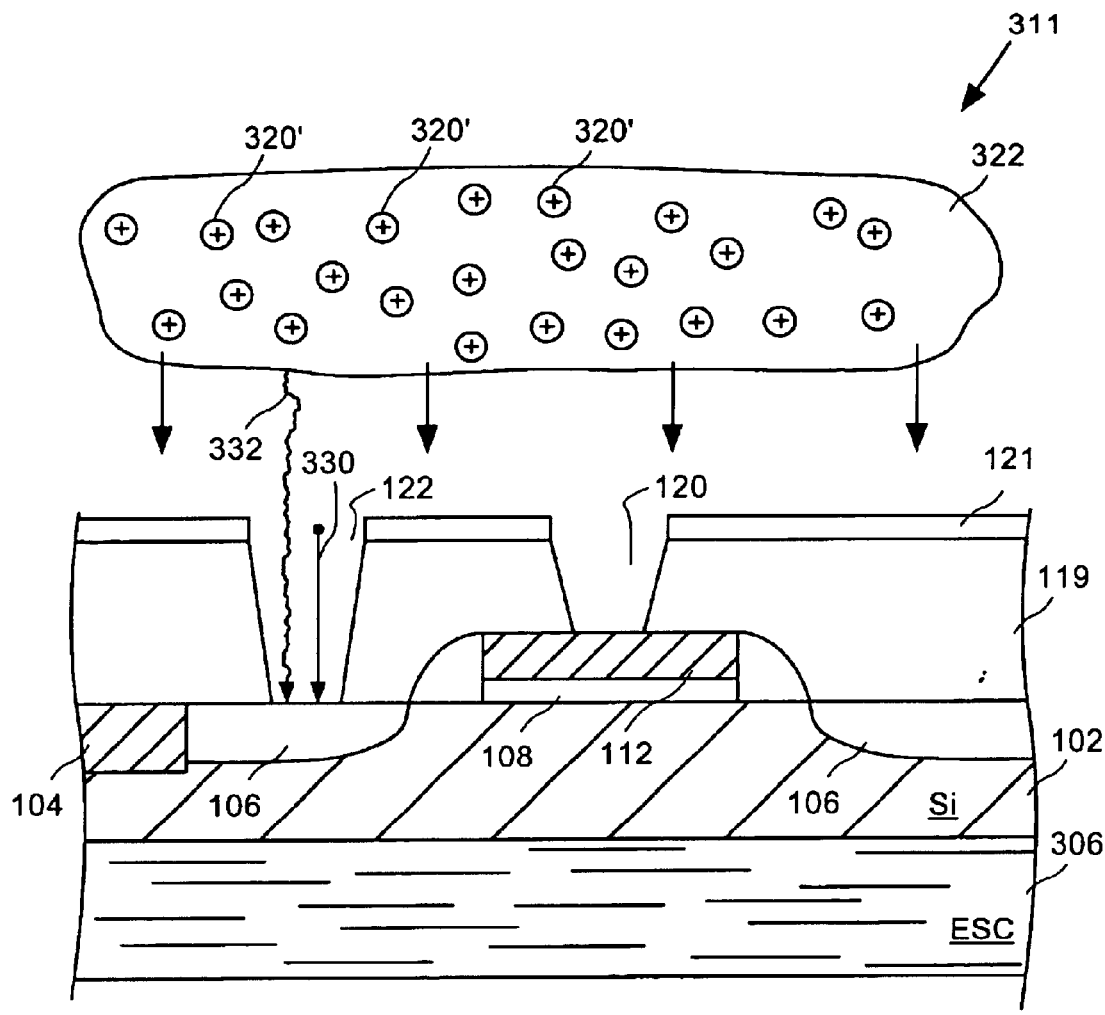
FIG. 3B is a simplified schematic illustration of the creation of an electrical path between a plasma and the wafer in the exemplary bias compensation etch system depicted in FIG. 3A, in accordance with still another embodiment of the present invention

Reference is now made to FIG. 3B depicting a partial, simplified, and magnified portion 311 illustrated in FIG. 2B, in accordance with one embodiment of the present invention. As shown, the strong electrical field created within the etch reactant chamber 304 causes the positively charged ions 320' of the plasma 320 to accelerate toward the photoresist 121 and the exposed portions of the ILD layer 119. In this manner, the positive ions 320' bombard the photoresist 121 and the exposed portions of the ILD layer 119 and gradually remove the exposed portions of the ILD 119.

Initially, due to the ILD layer 119 being a dielectric, the resistance between the ILD layer 119 and the plasma 320 is significantly high. However, as the exposed portions of the ILD layer 119 are gradually etched and a thickness 330 of the exposed portions of the ILD layer 119 decreases, the resistance between the ILD layer 119 and the plasma 320 is reduced. As a result, an electrical path 332 is slowly created from the plasma 320 to the underlying layer, the source/drain diffusion regions 106 of the silicon substrate 102 or the polysilicon gates 112. However, the step rise in the bias compensation voltage occurs when the exposed portions of the ILD layer 119 are etched through, down to the source/drain diffusion regions 106 of the silicon substrate layer 102 (or even the polysilicon gates 112). Thus, the change in the resistance of the wafer 103 ultimately leads to a measurable change in the bias compensation voltage. Thus, any change, whether up or down, which can be differentiated from some constant flow can function as an indicator of reaching end point. In experiments, it has been noticed that the change has varied between about five (5) V and about 30 V. Thus, advantageously, the bias compensation SAC etch system of the present invention has eliminated the need to implement the silicon nitride stop layers typically implemented as process margins in the conventional SAC etch processes.

Figure 4:
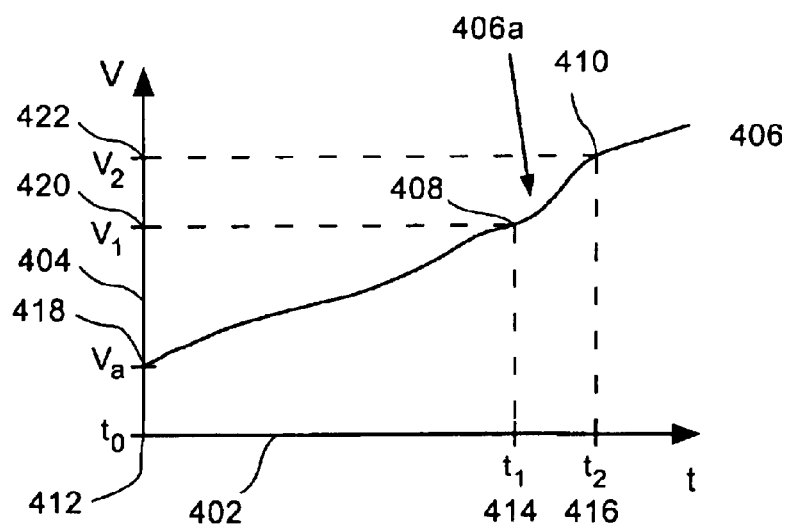
FIG. 4 illustrates a graph plotting bias compensation voltage of the ESC vs. etch time, in accordance with still another embodiment of the present invention.

FIG. 4 illustrates a graph 406 that plots bias compensation voltage of the ESC vs. etch time, in accordance with one embodiment of the present invention. As shown, having a bias compensation V-axis 404 as the y-axis and the etch time t-axis 402 as the x-axis, the graph 406 illustrates the changes in the ESC bias compensation voltage as the ILD layer is etched. At time $t_0$ 412, the bias compensation voltage of the ESC is measured to be about $V_a$, which corresponds to a point 418 on the bias compensation V-axis 404 and the graph 406. In this example, once etching of the ILD layer is initiated, the graph 406 starts ascending and continues to do so as the etch process continues. Once the etch process approaches the point in time where the desired layer (i.e., the ILD layer) has been removed and the underlying layer (i.e., the source/drain regions of the silicon substrate or the polysilicon gates) has been exposed (e.g., target endpoint), an endpoint signal in the form of a step increase 406a, is detected in the graph 406. By way of the example depicted in FIG. 4, the step increase 406a as defined between points 408 and 410 of the graph 406 may occur between the corresponding time range of $t_1$ to $t_2$ and respective anticipated bias compensation voltage range of $V_1$ to $V_2$.

At the beginning of the etch process, $t_0$, the ILD layer provides a substantially higher resistance between the underlying source/drain regions of the substrate silicon and the plasma. This resistance is reduced as the exposed portions of the ILD layer are gradually removed through the etch process. As a result, an electrical path is created from the plasma to the underlying source/drain regions of the silicon substrate. However, the bias compensation voltage is very sensitive to changes in the wafer resistance. Thus, in response to the changes in the wafer resistance, the bias compensation voltage is increased from a bias compensation voltage $V_a$ to $V_1$, as the etch process continues from $t_0$ to $t_1$, creating an ascending graph 406.

Once the exposed portions of the ILD layer are physically removed and the underlying source/drain regions of the silicon substrate are exposed, the etch endpoint signal in the form of the step increase 406a is detected in the ESC bias compensation voltage. For instance, in one implementation, the point 408 of the graph 406 corresponds to the time $t_1$ in which at least a portion of the underlying source/drain regions of the silicon substrate become exposed. Comparatively, a point 410 of the graph 406 corresponds to a time $t_2$ at which the exposed portions of the ILD layer have substantially been removed exposing the underlying source/drain regions of the silicon substrate and the polysilicon gates.

Although in this embodiment the etch process endpoint is evidenced with a step increase in the bias compensation voltage, in a different example, the etch process endpoint may be evidenced by a sharp downward slope, a spike, or a sudden dip in the bias compensation signal. Therefore, it must be appreciated that irrespective of the shape of the bias compensation signal, the end of the etch process is evidenced with a distinct change in the bias compensation voltage. Thus, performing sample etching operations on sample substrates can be used to determine the specific characteristics and shape of the etch endpoint bias compensation signal. In this manner, the endpoint monitoring systems can be instructed to search for the ascertained characteristic and shape in the bias compensation plot so as to define the etch endpoint. Additional details concerning implementing the bias compensation to detect the endpoint of an etch process are described in U.S. Pat. No. 6,228,278, issued on May 8, 2001, and entitled "Methods and apparatus for determining an etch endpoint in a plasma processing system," having inventors Jaroslaw W. Winniczek, M. J. Francois Chandrasekar Dassapa, Eric A. Hudson and Mark Wiepking. The disclosure of this U.S. Patent, which is assigned to Lam Research Corporation, the assignee of the subject application, is incorporated herein by reference.

Figure 5A:
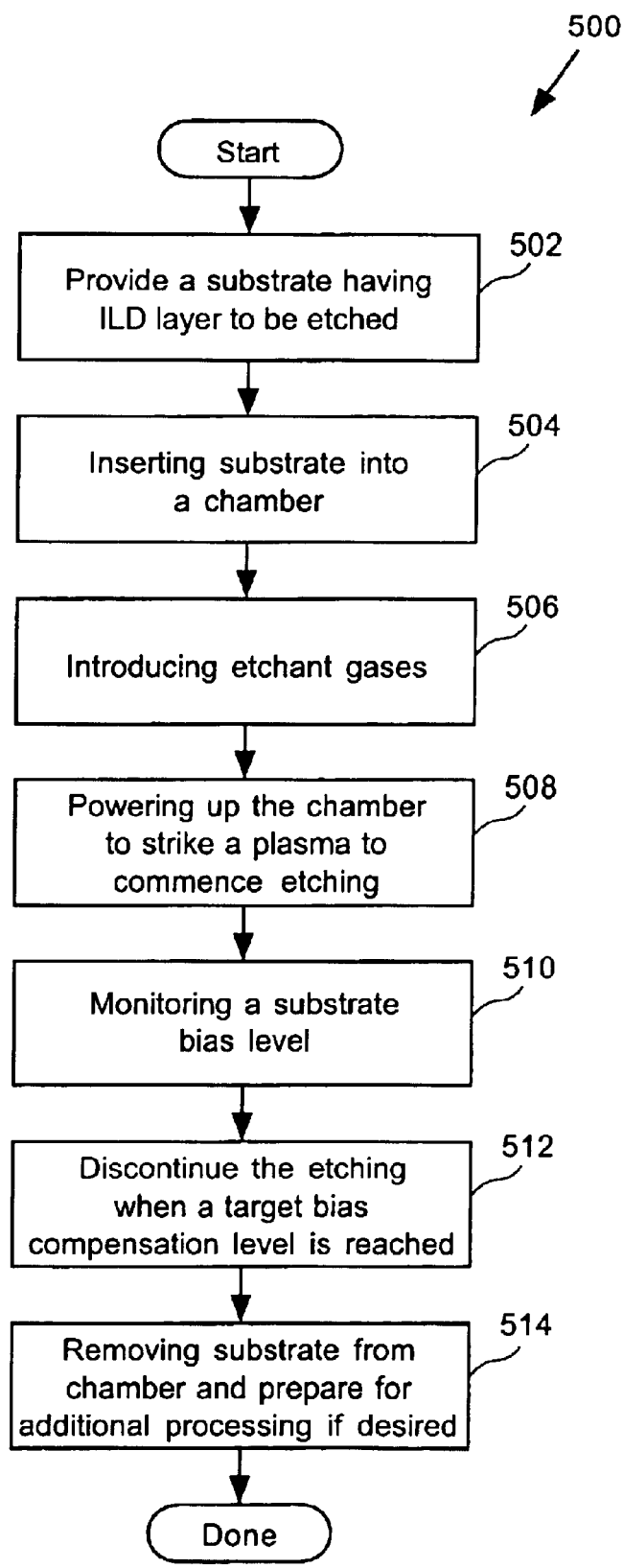
FIG. 5A is a flowchart diagram illustrating method operations performed in an exemplary bias compensation etch system, in accordance with yet another embodiment of the present invention.

Reference is now made to a flowchart diagram 500 of FIG. 5A illustrating method operations performed in a bias compensation SAC etch system of the present invention, in accordance with one embodiment of the present invention. The method begins in operation 502 in which a substrate having an ILD layer to be etched is provided. As was explained in more detail above with reference to FIGS. 1A–1C, the bias compensation SAC etch system of the present invention can be implemented to detect the etch endpoint in substrates which do not include silicon nitride stop layers. Thus, as discussed above, advantageously, the ILD layer of the present invention is formed substantially directly on the silicon substrate and the polysilicon gates without a need to include stop layers as a process margin.

Next, in operation 504, the substrate is inserted into a chamber and is disposed on an electrostatic chuck (ESC). In addition to the ESC, in one example, the chamber further includes a showerhead, containment rings, and other standard chamber hardware and associated software. Once the substrate is inserted into the chamber, etchant gases are introduced into the chamber in operation 506. In one embodiment, a plurality of holes defined within the showerhead are implemented to introduce the etchant gases into the chamber. Further information with respect to the gases implemented as etchants and their compositions is provided below in connection with FIG. 5B.

Continuing to operation 508, the chamber is powered up to strike the plasma, thereby commencing the etching operation. For instance, in one example, once an RF power supply coupled to the ESC is turned on, the gases released into the chamber are excited, initiating the plasma etching process. Additional information with respect to powering up the chamber is provided below in connection with FIG. 5C. Once the etching operation has commenced, in operation 510 a bias level of the substrate is monitored. This is important as the current flowing to the ESC poles change due to the changes in the substrate bias level as the etching operation continues. In one embodiment, these current changes are used to produce a feedback signal to the bias compensation power supply designed to maintain the current flow to the ESC poles substantially equal. Thus, as the etching operation progresses, the changes in the wafer bias level ultimately leads to changes in the bias compensation voltage.

Once a target bias compensation level is reached, the etching process is discontinued in operation 512. Specifically, this occurs when the exposed portions of the ILD layer have substantially been removed thereby exposing a portion of the underlying source/drain regions of the silicon substrate or the polysilicon gates. At this time, in one example, an etch endpoint signal in a form of a step increase can be detected in the bias compensation voltage. In this operation, the etch process is discontinued once the step increase in the bias compensation level is detected.

Finally, in operation 514, the substrate is removed from the chamber and the chamber and the substrate are prepared for further processing, if desired. That is, the chamber is prepared for performing an etch operation on a different substrate.

Figure 5B:
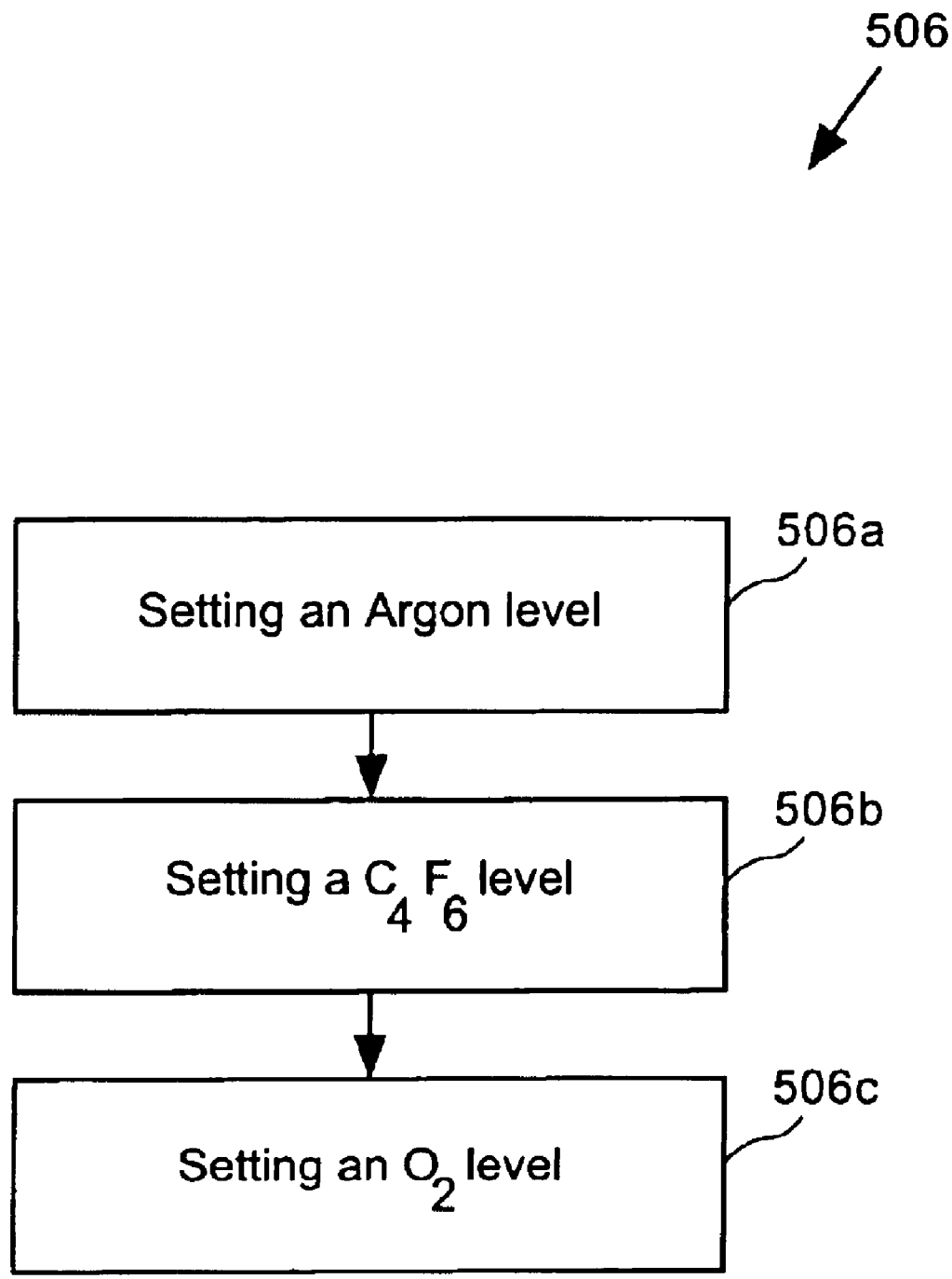
FIG. 5B is a flowchart diagram illustrating the introduction of etchant gases into a chamber, in accordance with still another embodiment of the present invention.

The introduction of etchant gases into the chamber can further be understood with respect to the flow chart diagram depicted in FIG. 5B, in accordance with one embodiment of the present invention. First, in operation 506a an argon level is set. By way of example, the flow rate of argon may be set to be 260 standard cubic centimeter per minute (sccm). Next, in operation 506b a level is set for $C_4F_6$ which is subsequently followed by operation 506 wherein a level is set for oxygen. For instance, in one preferable example, the flow rate of $C_4F_6$ and oxygen may be set to be about 11 sccm, about 12 sccm, respectively. However, one of ordinary skill in the art must bear in mind that depending on the type of material being etched, a wide range of gas chemistries may be implemented.

Figure 5C:
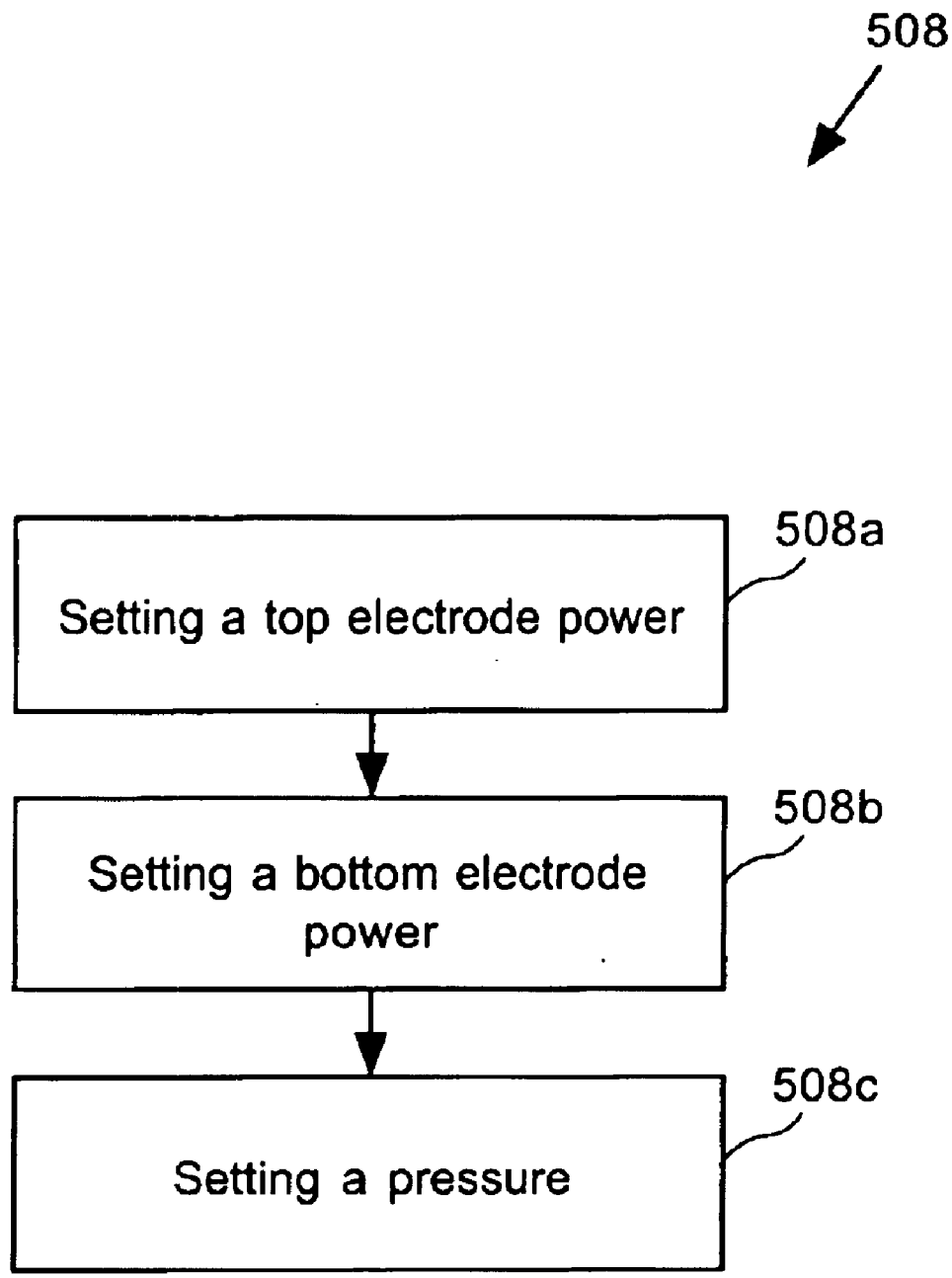
FIG. 5C is a flow chart diagram illustrating the method operations performed in the powering up a chamber, in accordance with yet another embodiment of the present invention.

Reference is made to the flow chart diagram of FIG. 5C illustrating the method operations performed in powering up the chamber in operation 508, in accordance with one embodiment of the present invention. In operations 508a and 508b, a top electrode power and a bottom electrode power are set, respectively. As discussed in more detail above with reference to FIGS. 3A–3B, each of the top and bottom electrodes are coupled to a radio frequency (RF) power. Preferably, in one example, each RF power applies approximately about 1400 watts (W) and 1100 watts (W) to the respective top electrode and bottom electrode. Finally, a pressure level is set in operation 508c, which in one implementation, maintains approximately about 82 militorr (mT) pressure inside the etch chamber.

What is claimed is:

1. A method for enhancing the fabrication process of a self-aligned contact (SAC) structure, the method comprising:

forming a transistor structure on a surface of a substrate;

forming a dielectric layer directly over the surface of the substrate without forming an etch stop layer thereon;

plasma etching a self-aligned contact hole through the dielectric layer in a plasma processing chamber;

monitoring a bias compensation voltage of the plasma processing chamber during the plasma etching; and discontinuing the plasma etch process upon detecting an endpoint signaling change in the bias compensation voltage.

2. A method for enhancing the fabrication process of a self-aligned contact (SAC) structure as recited in claim 1, wherein the endpoint signaling change in the bias compensation voltage is detected when a portion of the surface of the substrate underlying the self-aligned contact hole is substantially exposed.

3. A method for enhancing the fabrication process of a self-aligned contact (SAC) structure as recited in claim 1, wherein the endpoint signaling change is an expected step increase in the bias compensation voltage.

4. A method for enhancing the fabrication process of a self-aligned contact (SAC) structure as recited in claim 1, wherein forming the transistor structure on the surface of the substrate includes, forming a gate structure over the surface of the substrate;

forming spacers along sidewalls of the gate structure; and forming source/drain diffusion regions into the surface of the substrate, the source/drain diffusion regions being defined substantially outside of the spacers formed along sidewalls of the gate structure.

5. A method for enhancing the fabrication process of a self-aligned contact (SAC) structure as recited in claim 1, wherein the dielectric layer is an interlevel dielectric (ILD) layer.

6. A method as recited in claim 1, wherein the bias compensation voltage is an electrostatic chuck (ESC) bias compensation voltage.

7. A method for enhancing the fabrication process of a self-aligned contact (SAC), the method comprising:

forming a transistor structure on a substrate, the transistor structure including a gate structure formed over a first surface of the substrate;

forming spacers along sidewalls of the gate structure;

forming source/drain diffusion regions into the first surface of the substrate, the source/drain diffusion regions being defined substantially outside of the spacers formed along sidewalls of the gate structure;

forming an interlevel dielectric (ILD) layer directly over the first surface of the substrate without forming a stop layer, such that the ILD layer overlies the gate structure, the spacers, and the first surface of the substrate;

forming a contact hole and a via hole through the ILD layer implementing a plasma etching process such that the via hole is defined to a top layer of the gate structure and the contact hole is defined to the source/drain diffusion regions;

monitoring an electrostatic chuck (ESC) bias compensation voltage during the plasma etching process; and discontinuing the plasma etching process when an endpoint signaling change in the ESC bias compensation voltage is detected.

8. A method for enhancing the fabrication process of a self-aligned contact (SAC) as recited in claim 7, the endpoint signaling change in the ESC bias compensation voltage is detected when a portion of the top layer of the gate structure underlying the via hole and a portion of the source/drain diffusion regions underlying the contact hole are substantially exposed.

9. A method for enhancing the fabrication process of a self-aligned contact (SAC) as recited in claim 7, wherein the gate structure includes, a gate oxide formed over the first surface of the substrate; and a polysilicon gate formed over the gate oxide.

10. A method for enhancing the fabrication process of a self-aligned contact (SAC) as recited in claim 7, wherein forming the ILD layer over the first surface of the substrate includes, depositing an oxide layer over the first surface of the substrate, the gate structure, and spacers;

depositing a tetraethylorthosilicate (TEOS) layer over the oxide layer; and depositing an oxide layer over the TEOS layer.

11. A method for enhancing the fabrication process of a self-aligned contact (SAC) as recited in claim 7, wherein forming spacers along the sidewalls of the gate structure includes, depositing a spacer layer over a first surface of the substrate and the gate structure; and performing a plasma etching process configured to define spacers along the sidewalls of the gate structure.

12. A method for accurately detecting a plasma etch endpoint of a self-aligned contact (SAC), the method comprising:

providing a substrate having a transistor structure on a surface of the substrate;

forming a dielectric layer directly over the surface of the substrate without forming an etch stop layer thereon;

inserting the substrate into a plasma etching chamber so as to plasma etch a self-aligned contact hole through the dielectric layer;

introducing etchant gases into the plasma etching chamber;

powering up the plasma etching chamber, the powering up configured to strike a plasma so as to commence the plasma etching process;

monitoring a bias level of the plasma etching chamber during the plasma etching process; and discontinuing the plasma etching process when an endpoint signaling change in a bias compensation voltage is detected.

13. A method for accurately detecting a plasma etch endpoint of a self-aligned contact (SAC) as recited in claim 12, wherein the endpoint signaling change is an expected step increase in the bias compensation voltage.

14. A method for accurately detecting a plasma etch endpoint of a self-aligned contact (SAC) as recited in claim 12, wherein the dielectric layer is an interlevel dielectric (ILD) layer.

15. A method as recited in claim 12, wherein the bias compensation voltage is an electrostatic chuck (ESC) bias compensation voltage.

16. A method for accurately detecting a plasma etch endpoint of a self-aligned contact (SAC) as recited in claim 12, wherein the endpoint signaling change in the bias compensation voltage is detected when a portion of the surface of the substrate underlying the self-aligned contact hole is substantially exposed.

17. A method for accurately detecting a plasma etch endpoint of a self-aligned contact (SAC) as recited in claim 16, wherein the portion of the surface of the substrate underlying the self-aligned contact hole is a gate structure.

18. A method for enhancing the fabrication process of a self-aligned contact (SAC) structure, the method comprising:

forming a transistor structure on a surface of a substrate;

forming a dielectric layer directly over the surface of the substrate without forming an etch stop layer thereon;

plasma etching a self-aligned contact hole through the dielectric layer in a plasma processing chamber;

monitoring a bias compensation voltage of the plasma processing chamber during the plasma etching; and discontinuing the plasma etch process upon detecting an endpoint signaling change in the bias compensation voltage, wherein the endpoint signaling change in the bias compensation voltage is detected when a portion of the surface of the substrate underlying the self-aligned contact hole is substantially exposed.

19. A method as recited in claim 18, wherein bias compensation voltage is an electrostatic chuck (ESC) bias compensation voltage.

* * * * *